(12) United States Patent
Lee

(10) Patent No.: US 7,359,195 B2
(45) Date of Patent: Apr. 15, 2008

(54) HEATSINK

(75) Inventor: Sang Cheol Lee, Kyungki-do (KR)

(73) Assignee: Zalman Tech Co., Ltd (KR)

( * ) Notice: Subject to any disclaimer, the term of this patent is extended or adjusted under 35 U.S.C. 154(b) by 211 days.

(21) Appl. No.: 11/231,723

(22) Filed: Sep. 20, 2005

(65) Prior Publication Data

US 2006/0061970 A1    Mar. 23, 2006

(30) Foreign Application Priority Data

Sep. 20, 2004   (KR) .................. 10-2004-0075130

(51) Int. Cl.
*H05K 7/20* (2006.01)
*F28F 7/00* (2006.01)
*H01L 23/34* (2006.01)

(52) U.S. Cl. .................. 361/697; 165/80.3; 165/78; 165/121; 165/185; 257/722; 361/703

(58) Field of Classification Search .............. 165/80.3, 165/185, 78, 121; 257/722; 361/697, 703
See application file for complete search history.

(56) References Cited

U.S. PATENT DOCUMENTS

| | | | | |
|---|---|---|---|---|
| 5,583,746 A | * | 12/1996 | Wang .................. | 361/697 |
| 6,289,975 B2 | * | 9/2001 | Kuo .................. | 165/80.3 |
| 6,698,499 B1 | * | 3/2004 | Wagner et al. ........... | 165/80.3 |
| 6,712,127 B2 | * | 3/2004 | Lee .................. | 165/80.3 |
| 6,782,941 B2 | * | 8/2004 | Lee .................. | 165/80.3 |
| 6,958,915 B2 | * | 10/2005 | Wang et al. ............. | 361/709 |
| D540,750 S | * | 4/2007 | Lee .................. | D13/179 |
| 2001/0010264 A1 | * | 8/2001 | Kuo .................. | 165/185 |

\* cited by examiner

*Primary Examiner*—Gregory D Thompson
(74) *Attorney, Agent, or Firm*—Tuchman & Park LLC

(57) ABSTRACT

Provided is a heatsink comprising: a plurality of sheet-shaped heat-dissipating plates stacked on one another, each heat dissipating plate including a heat-absorbing region that has a lower end contacting a heat source to absorb heat from the heat source and a heat-dissipating region that extends from both sides of the heat-absorbing region to absorb heat from the heat-absorbing region and outwardly dissipate the heat, wherein the heat-absorbing regions are tightly joined to one another by applying an external pressure to form a central portion and the heat-dissipating regions are radially spread out about the central portion, wherein each of the heat-dissipating regions includes a long heat-dissipating region and a short heat-dissipating region, which are asymmetric with respect to the central portion. Accordingly, the heatsink can efficiently dissipate heat generated from the heat source mounted on an edge of a narrow circuit board by efficiently utilizing a space over the circuit board.

12 Claims, 9 Drawing Sheets

HEATSINK

BACKGROUND OF THE INVENTION

This application claims the priority of Korean Patent Application No. 10-2004-0075130, filed on Sep. 20, 2004, in the Korean Intellectual Property Office, the disclosure of which is incorporated herein in its entirety by reference.

1. Field of the Invention

The present invention relates to a heatsink used in a computer, and more particularly, to a heatsink including a plurality of thin heat-dissipating plates each of which has a long heat-dissipating region and a short heat-dissipating region to effectively cool electronic components mounted on a narrow electric circuit board.

2. Description of the Related Art

Heatsinks cool components that produce heat. Specifically, heatsinks absorb heat of electronic components, such as elements that generate heat during operation, and outwardly dissipate the absorbed heat to prevent overheating of the electronic components.

Electronic components, such as central processing units (CPUs), video graphics array (VGA) cards, and power transistors, produce a large amount of heat during operation. If an electronic component is heated over a predetermined temperature, errors may occur in the electronic component, or the electronic component may be damaged. For this reason, heatsinks are installed on such heating components to dissipate heat generated by the components into the air, thereby lowering the temperature of the electronic components.

With the rapid development of science and technology, a variety of electronic components or devices have been highly integrated and miniaturized in recent years. Accordingly, the amount of heat per unit area is also increased. If the size of heat sinks increases, the heat dissipating efficiency increases. However, heatsinks should keep up with the trend of miniaturization of the electronic components. Heatsinks are now manufactured to have various shapes to follow this trend and increase heat dissipation rate per unit area.

When seen from a position directly above heatsinks, the heatsinks have various shapes, for example, circular, oval, and square shapes. However, these various shapes of heatsinks share a common feature: they are symmetric as a whole. Both sides or four sides are symmetric with respect to the central line or center of the heatsinks.

If a heatsink is symmetrical and a circuit board on which a heat source is mounted is large, the size of the heatsink is determined only by considering the amount of heat of the heat source. However, if the circuit board is narrow and the heat source mounted on the circuit board is located not in the center of the circuit board but on an edge of the circuit board, it is difficult to use a symmetrical heatsink for effective heat dissipation. That is, if a large heatsink is mounted near an edge of a circuit board, part of the heatsink may extend out beyond the circuit board. In this case, it is highly possible that the heatsink will interfere with other electronic components mounted inside a computer.

SUMMARY OF THE INVENTION

The present invention provides a heatsink that can secure a sufficient heating area without extending out beyond a circuit board on which a heat source is mounted by making heat-dissipating regions of the heatsink asymmetric with respect to the heat source which a lower part of the heatsink contacts.

According to an aspect of the present invention, there is provided a heatsink comprising: a plurality of sheet-shaped heat-dissipating plates stacked on one another, each heat dissipating plate including a heat-absorbing region that has a lower end contacting a heat source to absorb heat from the heat source and a heat-dissipating region that extends from both sides of the heat-absorbing region to absorb heat from the heat-absorbing region and outwardly dissipate the heat, wherein the heat-absorbing regions are tightly joined to one another by applying an external pressure to form a central portion and the heat-dissipating regions are radially spread out about the central portion, wherein each of the heat-dissipating regions includes a long heat-dissipating region and a short heat-dissipating region, which are asymmetric with respect to the central portion.

The length of the short heat-dissipating regions may be in the range of $1/5$ to $4/5$ of the length of the long heat-dissipating regions.

The heat-absorbing regions may be tightly joined to one another in a thickness direction by a pair of compression blocks.

The heat-dissipating region may be disposed at one side of the heat-absorbing region, and heat-dissipating regions of adjacent heat-dissipating plates are located on opposite sides of the heatsink to each other with heat-absorbing regions of the heat-dissipating plates therebetween, wherein a spacer is formed on a vertical end of each heat-absorbing region between the heat-dissipating plates so that when the heat-absorbing regions of the stacked heat-dissipating plates are pressed, the heat-dissipating regions are separated from one another and radially spread out.

The heat-dissipating regions may be integrally formed with the heat-absorbing region to extend from both sides of the heat-absorbing region, wherein spacers are formed on each of the heat-dissipating regions of the heat-dissipating plates so that when the heat-absorbing regions of the stacked heat-dissipating plates are pressed, the heat-dissipating regions are separated from one another and radially spread out.

The heatsink may further comprise a cooling fan installed on the heatsink to blow cool air between the heat-dissipating regions, wherein a central axis of rotation of the cooling fan is eccentric with respect to the center of the central portion, and disposed toward the long heat-dissipating regions so that the amount of air blown between the long heat-dissipating regions is greater than the amount of air blown between the short heat-dissipating regions.

A plurality of cooling fans may be installed, and a central axis of rotation of each of the cooling fans may be disposed over the long heat-dissipating regions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Figure 1:
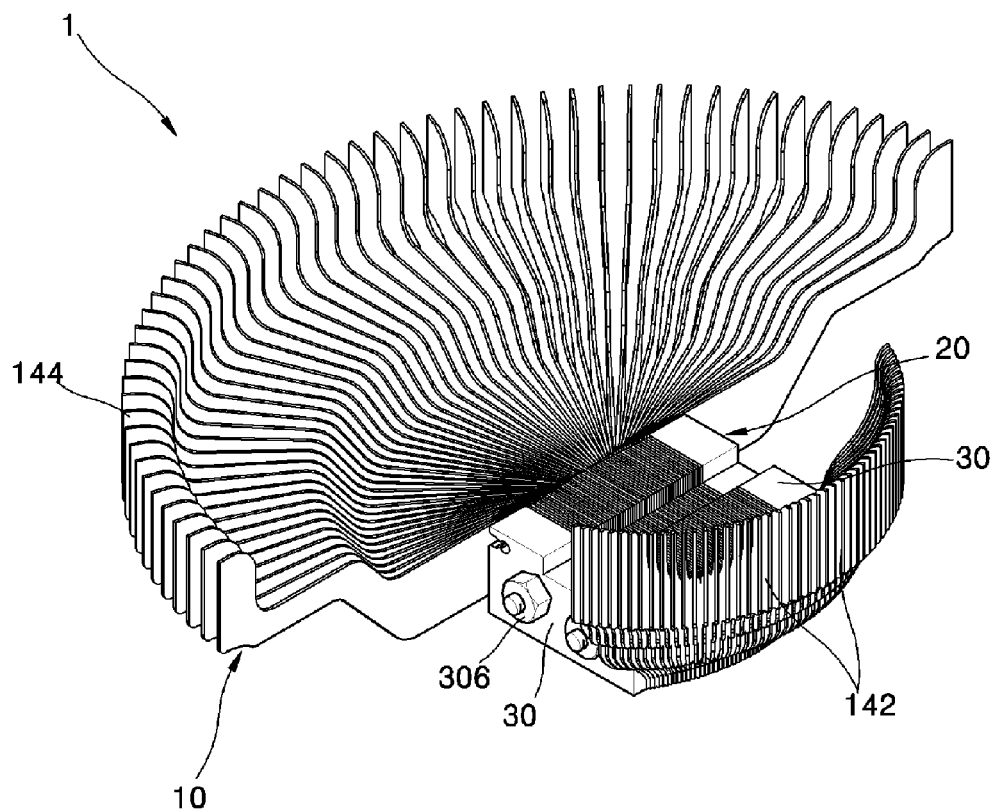
FIG. 1 is a perspective view of a heatsink according to an embodiment of the present invention.

The present invention will now be described more fully with reference to the accompanying drawings, in which preferred embodiments of the invention are shown.

A heatsink 1 according to an embodiment of the present invention includes a plurality of heat dissipating plates 10 and compression blocks 30.

Each of the heat-dissipating plates 10 includes a heat-absorbing region 12 and one or more heat-dissipating regions 14.

The heat-absorbing region 12 has a lower end that contacts a heat source 101 (see FIG. 5) to absorb heat from the heat source 101. Since the heat-absorbing regions 12 of the heat-dissipating plates 10 are integrally formed with the heat-dissipating regions 14, the heat-absorbing regions 12 and the heat-dissipating regions 14 are not physically divided. The heat-absorbing regions 12 are defined as the part that is tightly joined by the compression blocks 30 and has the lower ends of the heat-absorbing portions 12 contacting the heat source 101. A pair of through-holes 120 is formed in each of the heat-absorbing regions 12. Means for pressing the plurality of heat-absorbing regions 12 pass through the through-holes 120. The pressing means are bolts 304 and nuts 306 in the embodiment illustrated in FIGS. 1 through 5.

Figure 2:
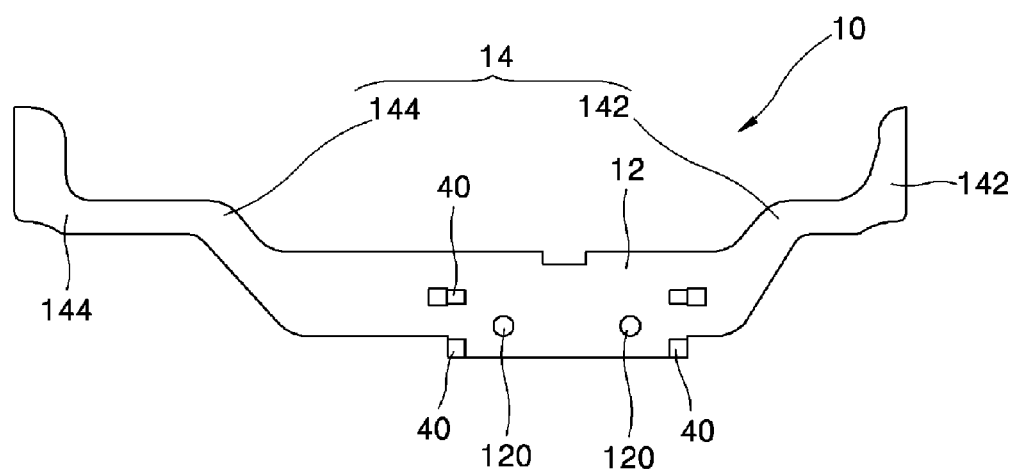
FIG. 2 is a schematic view of a heat-dissipating plate of the heatsink of FIG. 1.

Heat of the heat-absorbing regions 12 is conducted to the heat-dissipating regions 14, which dissipate the heat. The heat-dissipating regions 14 are integrally formed with the heat-absorbing regions 12 and extend from both sides of the heat-absorbing regions 12. Referring to FIG. 2, the heat-dissipating regions 14 of each heat-dissipating plate 10 are composed of a short heat-dissipating region 142 on the right side and a long heat-dissipating region 144 on the left side. The short heat-dissipating region 142 and the long heat-dissipating region 144 have similar shapes but are different in terms of how far they extend from the heat-absorbing region 12.

Each of the heat-dissipating plates 10 comprises a spacer 40. The spacers 40 are disposed between the heat-dissipating plates 10 to help the heat-dissipating plates 10 to be radially spread out.

Figure 3:
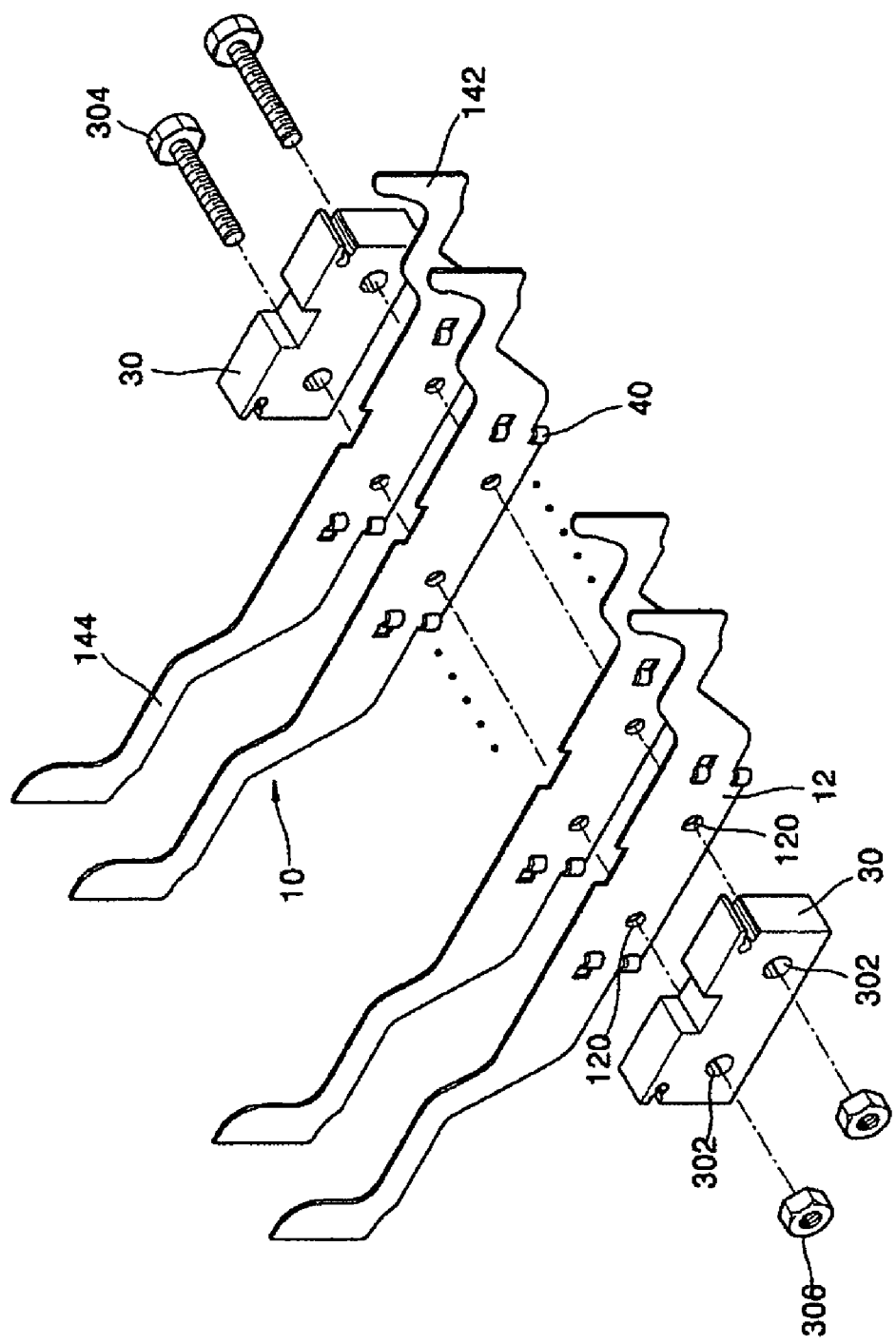
FIG. 3 is an exploded perspective view for explaining a method of assembling the heatsink of FIG. 1.

In the present embodiment illustrated in FIGS. 1 through 5, folded portions 40 are used as the spacers 40. Four folded portions 40 are formed on each heat-dissipating plate 10. Referring to FIG. 3, the folded portions 40 are formed on the short and long heat-dissipating regions 142 and 144 at the sides of the heat-absorbing region 12 of each heat-dissipating plate 10. That is, a pair of folded portions 40 is formed in a vertical direction on the long heat dissipating portion 144 near the heat-absorbing region 12. A pair of folded portions 40 is also formed in a vertical direction on the short heat-dissipating region 142 near the heat-absorbing region 12.

FIG. 3 is an exploded perspective view illustrating the stacked heat-dissipating plates 10 before they are pressed together by the pair of compression blocks 30. After the plurality of heat-dissipating plates 10 are stacked on one another in the thickness direction, the pair of compression blocks 30 are placed on both sides of the heat-dissipating plates 10. The compression blocks 30 are made of hard material, for example, iron or aluminium, and have the same area as that of the heat-absorbing regions 12. A pair of through-holes 302 is formed in the compression block 30 corresponding to the through-holes 120 of the heat-absorbing region 12.

Thereafter, the bolts 304 are passed through the through-holes 302 and 120 of the compression blocks 30 and the heat-absorbing regions 12 and the nuts 306 are screwed onto the bolts 304, such that the heat-absorbing regions 12 are pressed together in the thickness direction and tightly joined to one another. The tightly joined heat-absorbing regions 12 and the compression blocks 30 form a central portion 20.

If the heat-absorbing regions 12 are tightly joined to one another while the heat-dissipating plates 10 are stacked on one another, the outer ends of the heat-dissipating regions 14 are spread apart so as to be radially arranged about the central portion 20 due to the folded portions 40 of the heat-dissipating regions 14 near the heat-absorbing regions 12.

Figure 4:
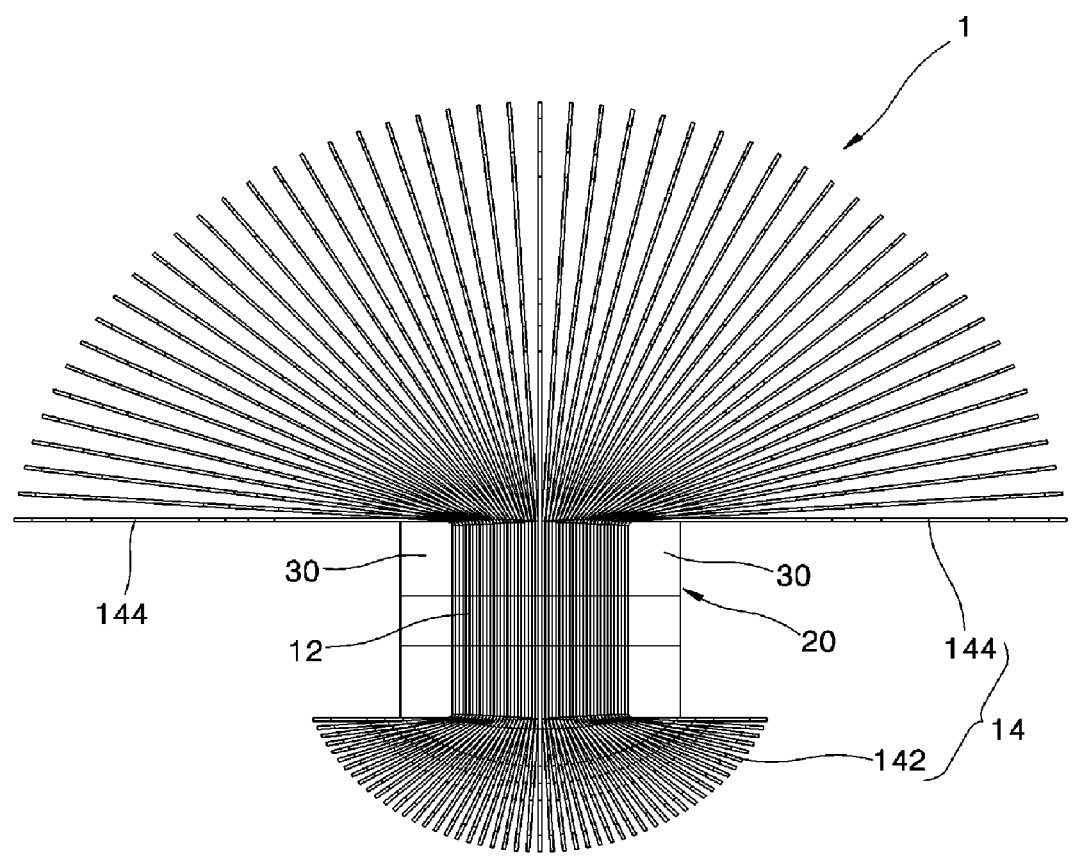
FIG. 4 is a plan view of the heatsink of FIG. 1.

FIG. 1 is a perspective view illustrating the plurality of heat-dissipating plates 10 tightly bound by the compression blocks 30 and the pair of bolts and nuts 304 and 306 such that the heat-dissipating regions 14 are radially spread out. FIG. 4 is a plan view of the heatsink 1. Referring to FIG. 4, the long heat-dissipating regions 144 and the short heat-dissipating regions 142 are radially spread out about the central portion 20, respectively.

Figure 5:
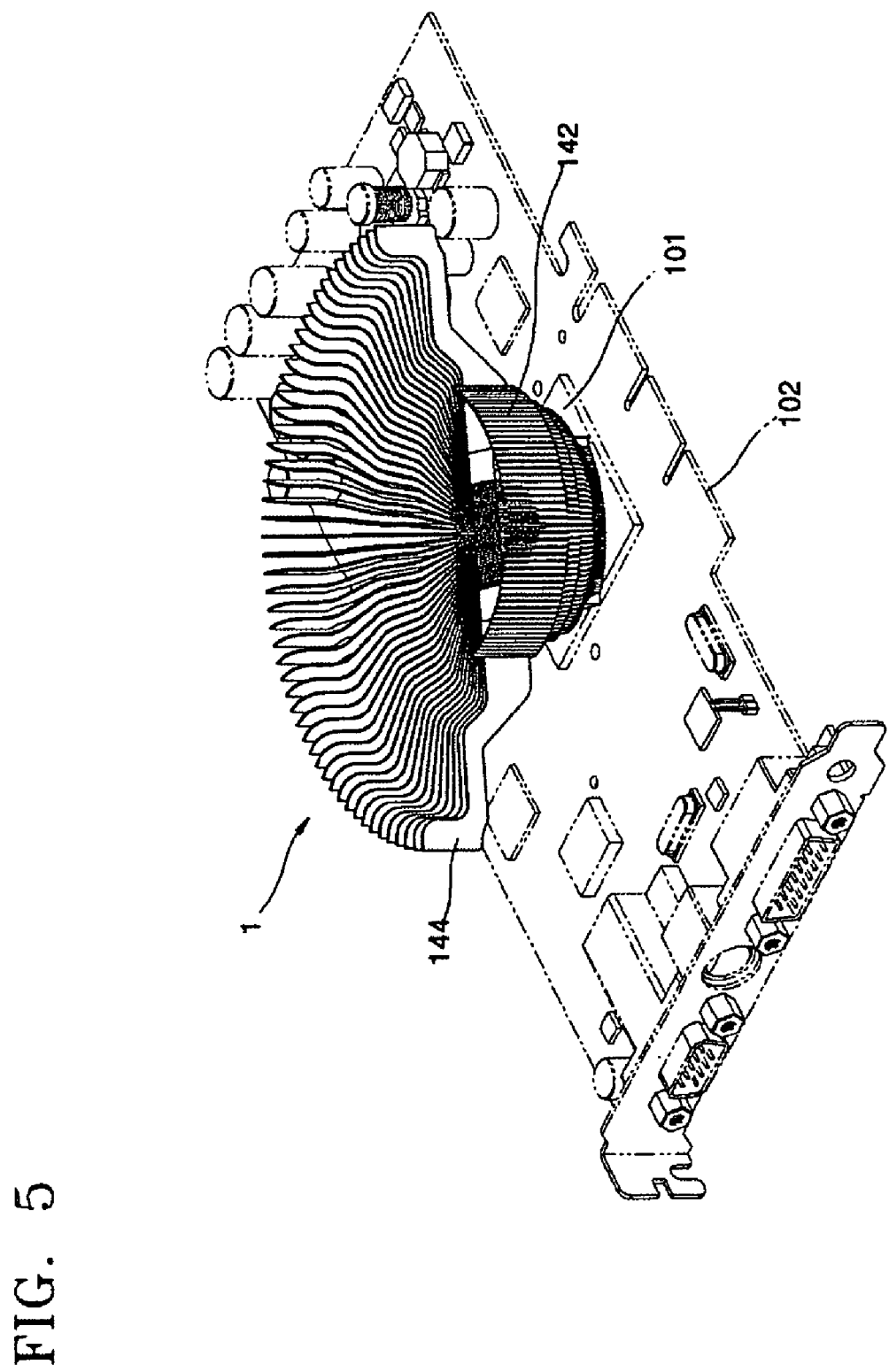
FIG. 5 is a perspective view illustrating the heatsink of FIG. 1 when it is mounted on a circuit board.

FIG. 5 is a perspective view illustrating an example where the heatsink 1 is mounted on the heat source 101 that is mounted on a circuit board 102. The circuit board 102 is a video graphics array (VGA) card, and the heat source 101 is a VGA card chipset. Here, the width of the circuit board 102 is less than the length of the circuit board 102, and the heat source 101 is mounted not at the center but near an edge of the circuit board 102.

To efficiently conduct heat away from the heat source 101 of the circuit board 102, lower parts of the heat-absorbing regions 12 of the heatsink 1 are coupled to the heat source 101. Here, the short heat-dissipating regions 142 are located at the side near the edge where the heat source 101 is mounted, and the long heat-dissipating regions 144 are located at the opposite side where a wider space is formed.

If a conventional symmetric heatsink is used in FIG. 5, the conventional heatsink may extend out beyond the circuit board 102, thereby interfering with other components residing in a computer. However, even though the heat source 101 is eccentrically mounted on the circuit board 102, the heatsink 1 of the present invention can be mounted on the heat source 101 without the heat dissipating regions 14 extending out beyond the circuit board 102 by locating the long heat-dissipating regions 144 in the wider space and the short heat-dissipating regions 142 in the smaller space of the circuit board 102, since the heat-dissipating regions 14 are asymmetric with respect to the central portion 20.

In the present embodiment illustrated in FIGS. 1 through 5, the length of the short heat-dissipating regions 142 is about $\frac{1}{3}$ of the length of the long heat-dissipating regions 144. The ratio of the short heat-dissipating regions 142 to the length of the long heat-dissipating regions 144 can be adjusted according to the size of the circuit board 102 or the position of the heat source 1014 mounted on the circuit board 102.

It is preferable that the length of the short heat-dissipating regions 142 be in the range of ⅕ to ⅘ of the length of the long heat-dissipating regions 144. If the length of the short heat-dissipating regions 142 is less than ⅕ of the length of the long heat-dissipating regions 144, the amount of heat dissipated by the short heat-dissipating regions 142 is too low. If the length of the short heat-dissipating regions 142 is greater than ⅘ of the length of the long heat-dissipating regions 144, there is little difference between the long heat-dissipating regions 144 and the short heat-dissipating regions 142, so the heatsink would be similar to the conventional symmetric heatsink.

Although the heat-absorbing regions 12 are pressed by the pair of compression blocks 30 in the present embodiment illustrated in FIGS. 1 through 5, the present invention is not limited thereto, and any method capable of pressing the heat-absorbing regions 12 in the thickness direction can be used.

Although the heat-dissipating plates 10 are thin metal plates in the present embodiment illustrated in FIGS. 1 through 5, the heat-dissipating plates 10 may be corrugated plates to have a larger heat dissipating area. In this case, the corrugated plates may include protrusions outwardly projecting from part of the heat-dissipating plates such that the protrusions act as spacers. The protrusions may be formed using the softness of the heat-dissipating regions made of metal. For example, through-holes may be formed at positions where the spacers are to be formed, and outer circumferential surfaces of the through-holes may be projected in one direction.

Figure 6:
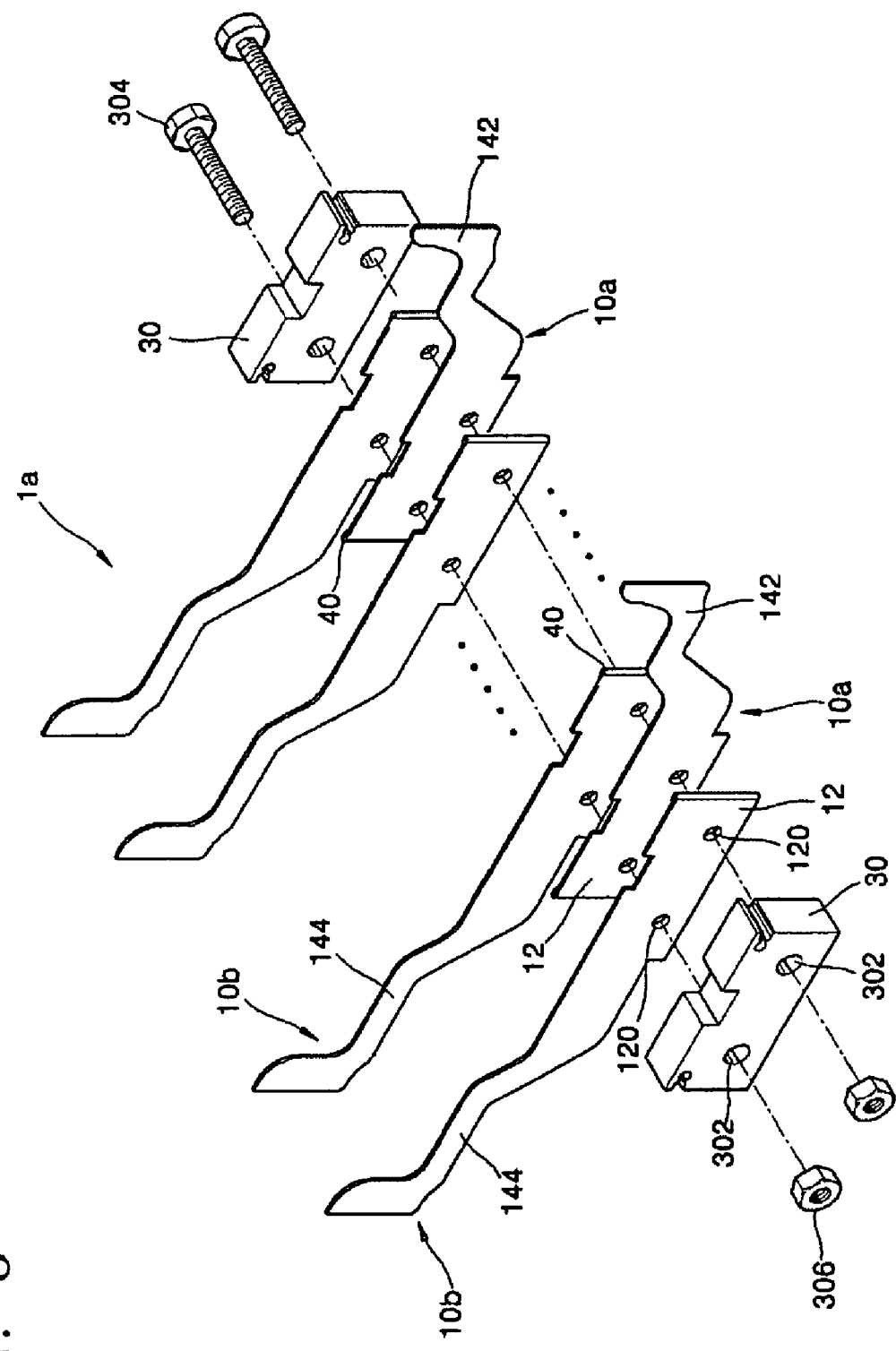
FIG. 6 is an exploded perspective view of a heatsink according to another embodiment of the present invention.

FIG. 6 is an exploded perspective view of a heatsink 1a including heat-dissipating plates 10a and 10b and compression blocks 30 according to another embodiment of the present invention.

In the embodiment illustrated in FIGS. 1 through 5, each of the heat-dissipating plates 10 includes the heat-absorbing region 12 formed at the center thereof and the long and short heat-dissipating regions 144 and 142 that are integrally formed with the heat-absorbing region 12 and extend from either side of the heat-absorbing region 12. The plurality of heat-dissipating plates 10 has the same shape. However, referring to FIG. 6, one heat-dissipating plate 10b including a heat-absorbing region 12 and a long heat-dissipating region 144, and another heat-dissipating plate 10a including a heat-absorbing region 12 and a short heat-dissipating region 142 have different shapes and are alternately stacked. That is, the long heat-dissipating regions 144 of the one heat-dissipating plates 10b are located on one side of the heatsink 1a and the short heat-dissipating regions 142 of the other heat-dissipating plates 10a are located on the other side of the heatsink 1a. The heat-dissipating plate 10b and the heat-dissipating plate 10a are partially overlapped such that the long heat-dissipating region 144 of the heat-dissipating plate 10b and the short heat-dissipating region 142 of the heat-dissipating plate 10a are disposed in opposite directions with the heat-absorbing regions 12 therebetween.

Figure 7:
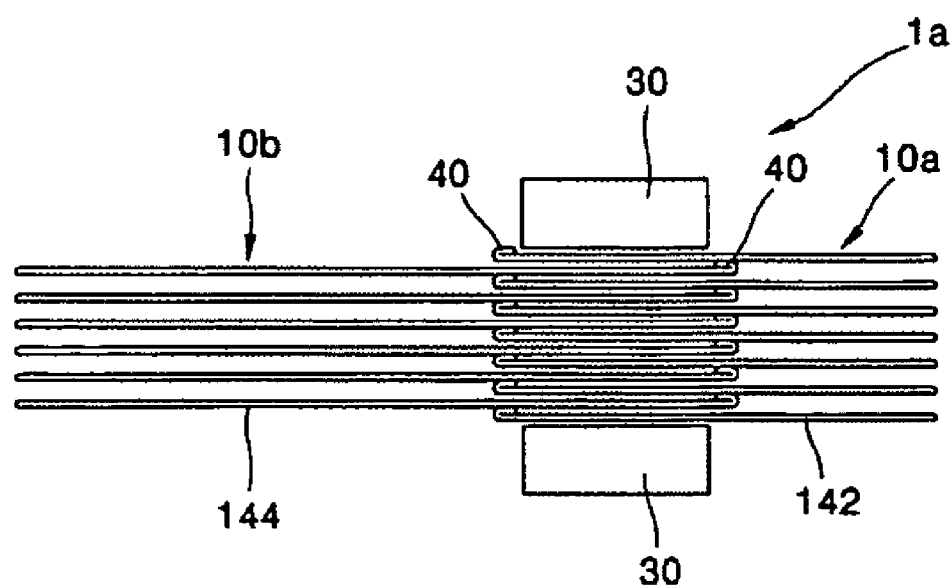
FIG. 7 is a schematic view illustrating heat-dissipating plates of the heatsink of FIG. 6 before they are pressed.

FIG. 7 illustrates the heat-dissipating plates 10b with the long heat-dissipating regions 144 disposed in one direction and the heat-dissipating plates 10a with the short heat-dissipating regions 142 disposed in the other direction before they are tightly joined by the pair of compression blocks 30 in the thickness direction. Here, the short heat-dissipating plates 10a and the long heat-dissipating plates 10b are alternately stacked on one another.

An end of the heat-absorbing region 12 of each of the heat-dissipating plates 10a and 10b, that is, an end of the heat-absorbing region 12 opposite to the heat-dissipating region 14 is folded in a vertical direction to form a folded portion 40.

The folded portions 40 acting as spacers are formed on both the short heat-dissipating plates 10a and the long heat-dissipating plates 10b. As shown in FIG. 7, as the heat-absorbing regions 12 of the stacked heat-dissipating plates 10a and 10b are pressed together, the folded portions 40 help outer ends of the heat-dissipating regions 142 and 144 to be separated from one another and radially spread out.

Although it is not shown in FIG. 7 that the heat-dissipating regions 142 and 144 are pressed and radially spread out, the spread-out shape is similar to that of the heatsink 1 of the embodiment illustrated in FIGS. 1 through 5. Also, the operation and effect of the heatsink 1a of the embodiment illustrated in FIGS. 6 and 7 are identical to those of the heatsink 1.

Figure 8:
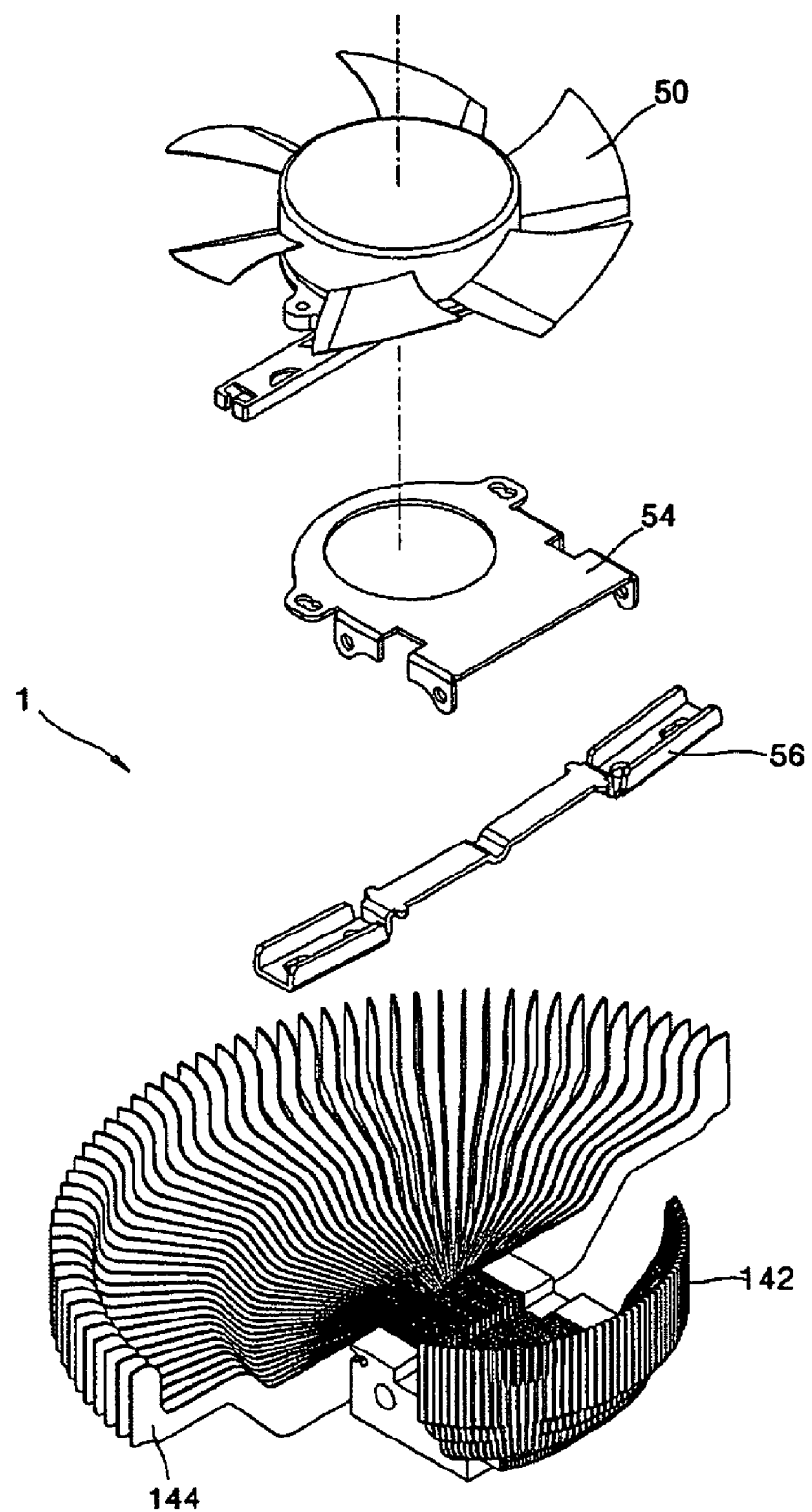
FIG. 8 is an exploded perspective view of the heatsink of FIG. 1 on which a cooling fan is installed.

Referring to FIG. 8, a cooling fan 50 is additionally employed in the heatsink 1 of the embodiment illustrated in FIGS. 1 through 5.

The cooling fan 50 is installed on the heatsink 1 to blow air between the long and short heat-dissipating regions 144 and 142 of the heat-dissipating plates 10. The cooling fan 50 is installed using frames 54 and 56 as shown in FIG. 8. The frame 56 is fixed to the central portion 20 and the other frame 54 is fixed to the frame 56. Thereafter, the cooling fan 50 is fixed to the frame 54. The cooling fan 50 can be mounted eccentrically in this way.

Figure 9:
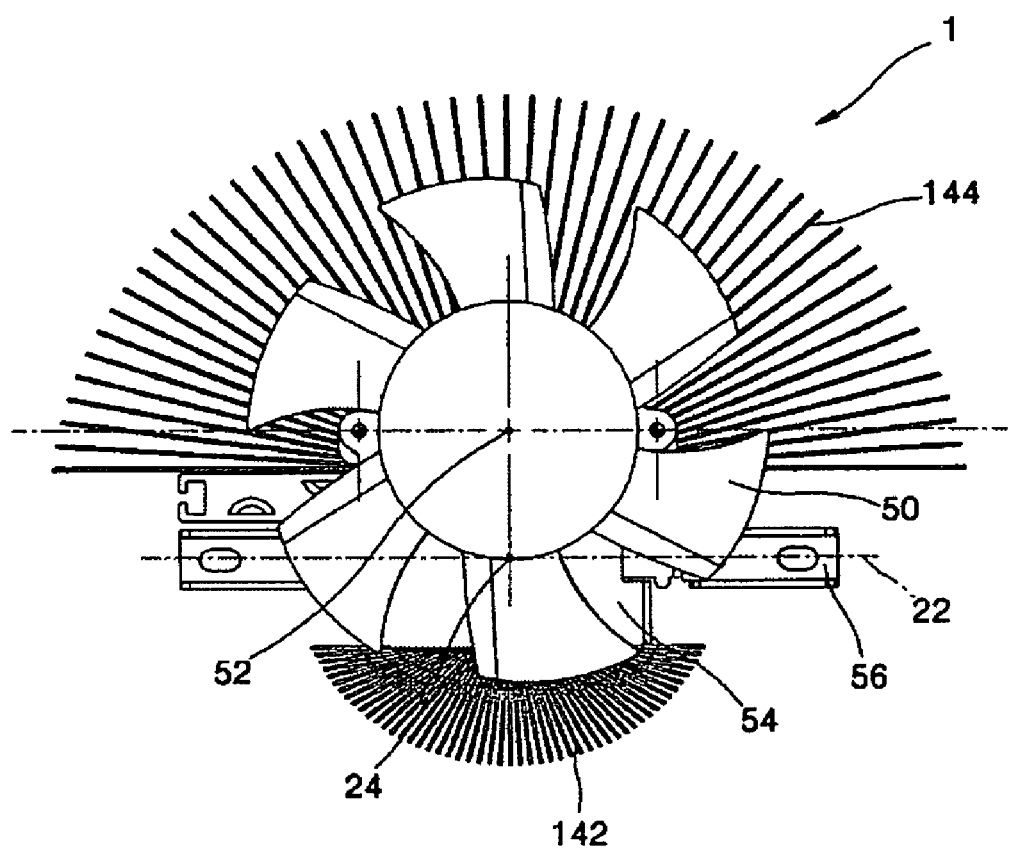
FIG. 9 is a plan view illustrating the heatsink of FIG. 8 on which the cooling fan is installed.

FIG. 9 is a plan view of the heatsink 1 on which the cooling fan 50 is installed.

A central axis of rotation 52 of the cooling fan 50 is eccentric with respect to a central line 22 or a center 24 of the central portion 20 toward the long heat-dissipating regions 144. In other words, the central axis of rotation 52 of the cooling fan 50 is disposed between the center 24 of the central portion 20 and the outer ends of the long heat-dissipating regions 144.

Since the central axis of rotation 52 of the cooling fan 50 is eccentric and disposed toward the long heat-dissipating regions 144, the amount of air blown by the cooling fan 50 to the long heat-dissipating regions 144 is greater than the amount of air blown to the short heat-dissipating regions 142. Accordingly, the long heat-dissipating regions 144 that can dissipate a greater amount of heat than the short heat-dissipating regions 142 can be effectively cooled due to the greater amount of air.

The air generated by the cooling fan 50 can cool heat generated by the heat source 101 and can also cool heat generated by electronic components disposed under the long heat-dissipating regions 144 among other electronic components mounted on the circuit board 102.

The size and position of the cooling fan 50 is not limited to the embodiments of the present invention, but can be varied within a range satisfying the conditions of the present invention. That is, the size of the cooling fan 50 may increase and the cooling fan 50 may be located at other positions.

Figure 10:
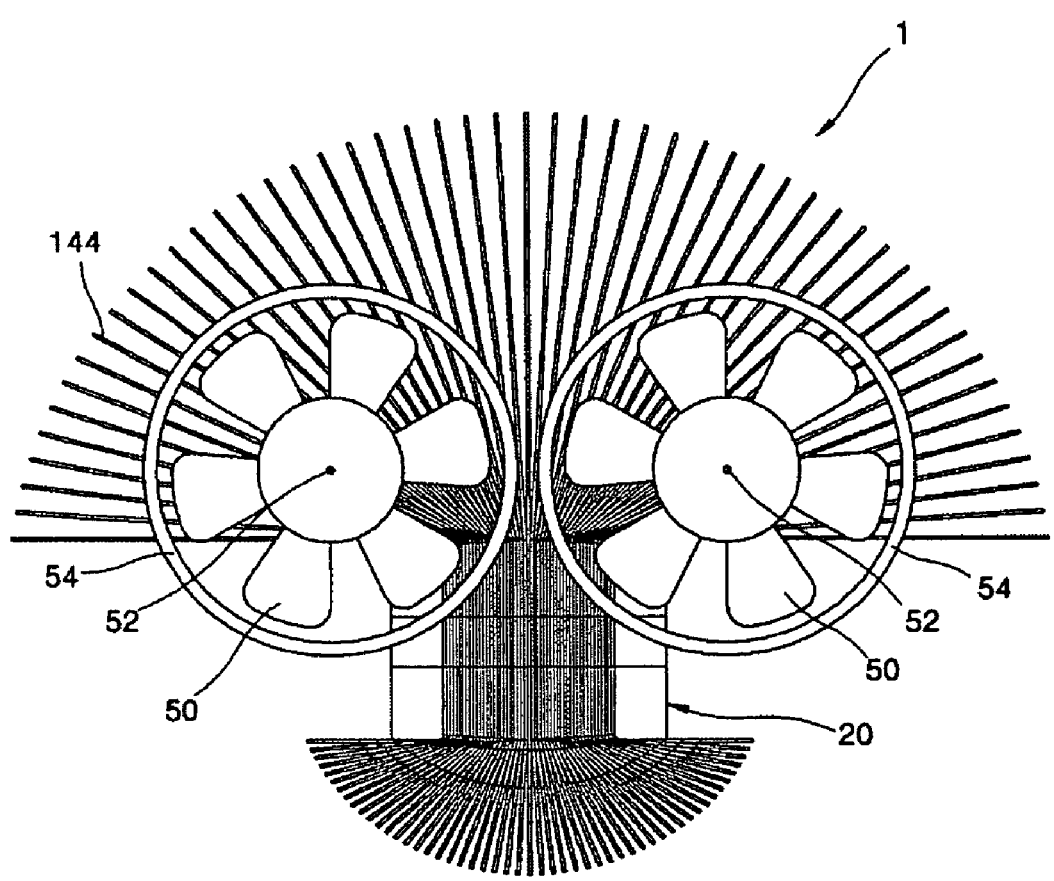
FIG. 10 is a plan view illustrating a state where a plurality of cooling fans is installed on the heatsink.

FIG. 10 is a plan view of the heatsink 1 on which two cooling fans 50 are installed. Central axes of rotation 52 of the respective cooling fans 50 pass through the long heat-dissipating regions 144. The number and positions of the cooling fans 50 can be changed for efficient cooling. A method of installing the cooling fans 50 on the heatsink 1 is well known in the art and a detailed explanation thereof will be omitted.

As described above, since the heat-dissipating regions on both sides are asymmetric with respect to the central portion, although the heatsink is mounted on a heat source that is placed near an edge of a narrow circuit board, efficient cooling can be achieved by efficiently using the space over the circuit board within the circuit board.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A heatsink comprising:
a plurality of heat-dissipating plates stacked on one another, each heat dissipating plate including a heat-absorbing region that has a lower end for contacting a heat source to absorb heat from the heat source, a long heat-dissipating region extending from a first side of the heat-absorbing region and a short heat-dissipating region extending from a second side of the heat-absorbing region, the long and short heat-dissipating regions for transferring heat from the heat-absorbing region and outwardly dissipating the heat,
wherein the heat-absorbing regions are joined to one another and the long and short heat-dissipating regions are spread out from the heat-absorbing regions,
wherein the length of each of the long heat-dissipating regions extending from the first side of the heat-absorbing regions is greater than the length of each of the short heat-dissipating regions extending from the second side of the heat-absorbing regions to define an asymmetric shape as a whole when the heatsink is installed to the heat source for cooling.

2. The heatsink of claim 1, wherein the length of each of the short heat-dissipating regions is in the range of $\frac{1}{5}$ to $\frac{4}{5}$ of the length of each of the long heat-dissipating regions.

3. The heatsink of claim 1, wherein the heat-absorbing regions are tightly joined to one another in a thickness direction by a pair of compression blocks.

4. The heatsink of claim 1, wherein the heat-dissipating regions are separated from one another and radially spread out.

5. The heatsink of claim 1, wherein
spacers are formed on the heat-dissipating regions of the heat-dissipating plates so that when the heat-absorbing regions of the stacked heat-dissipating plates are pressed, the heat-dissipating regions are separated from one another and radially spread out.

6. The heatsink of claim 1, further comprising a cooling fan installed on the heatsink to blow cool air between the heat-dissipating regions,
wherein a central axis of rotation of the cooling fan is eccentric with respect to the center of the heat-absorbing regions of the stacked heat-dissipating plates, and disposed toward the long heat-dissipating regions so that the amount of air blown between the long heat-dissipating regions is greater than the amount of air blown between the short heat-dissipating regions.

7. The heatsink of claim 6, wherein a plurality of cooling fans are installed, and a central axis of rotation of each of the cooling fans is disposed over the long heat-dissipating regions.

8. A heatsink comprising:
a first group of heat-dissipating plates, each of the first group of heat dissipating plates including a heat-absorbing region with a lower end for contacting a heat source to absorb heat from the heat source and a heat-dissipating region extending from a left side of the heat-absorbing region, the heat-dissipating region for transferring heat from the heat-absorbing region and outwardly dissipating the heat; and
a second group of heat-dissipating plates, each of the second group of heat dissipating plates including a heat-absorbing region with a lower end for contacting the heat source to absorb heat from the heat source and a heat-dissipating region extending from a right side of the heat-absorbing region, the heat-dissipating region for transferring heat from the heat-absorbing region and outwardly dissipating the heat;
wherein the first and second groups of heat-dissipating plates are alternately stacked one after another and joined together at the heat-absorbing regions thereof with the heat-dissipating regions spread out from the heat-absorbing regions;
wherein the length of the heat-dissipating region of each of the first group of heat-dissipating plates extending from the left side of the heat-absorbing regions is greater than the length of the heat-dissipating region of each of the second group of heat-dissipating plates extending from the right side of the heat-absorbing regions to define an asymmetric shape as a whole when the heatsink is installed to the heat source for cooling.

9. The heatsink of claim 8, wherein the length of the heat-dissipating region of each of the first group of heat-dissipating plates is in the range of $\frac{1}{5}$ to $\frac{4}{5}$ of the length of the heat-dissipating region of each of the second group of heat-dissipating plates.

10. The heatsink of claim 8, wherein the heat-absorbing regions of the first and second groups of heat-dissipating plates are securely joined, and the heat-dissipating regions of the first and second groups of heat-dissipating plates are radially spread out.

11. The heatsink of claim 8, wherein spacers are formed on the first and second groups of heat-dissipating plates so that when the heat-absorbing regions of the stacked heat-dissipating plates are securely joined, the heat-dissipating regions of the first and second groups of heat-dissipating plates are separated from one another and radially spread out.

12. The heatsink of claim 8, further comprising a cooling fan installed on the heatsink to blow cool air between the first and second groups of heat-dissipating plates.

* * * * *